United States Patent [19]
Choo et al.

[11] Patent Number: 5,587,710
[45] Date of Patent: Dec. 24, 1996

[54] SYNTAX BASED ARITHMETIC CODER AND DECODER

[75] Inventors: Chang Y. Choo, San Jose; Xiaonong Ran, Cupertino; Christine A. Porter, San Jose; Mohammad R. Motamedi, Palo Alto, all of Calif.

[73] Assignee: National Semiconductor Corporation, Santa Clara, Calif.

[21] Appl. No.: 409,448

[22] Filed: Mar. 24, 1995

[51] Int. Cl.⁶ .................................................. H03M 7/00
[52] U.S. Cl. ......................... 341/107; 341/67; 341/51
[58] Field of Search ............................ 341/107, 50, 51, 341/67, 106; 345/202

[56] References Cited

U.S. PATENT DOCUMENTS

| 4,286,256 | 8/1981 | Langdon, Jr. et al. | 341/107 |
|---|---|---|---|
| 4,652,856 | 3/1987 | Mohiuddin et al. | 341/60 |
| 4,989,000 | 1/1991 | Chevion et al. | 341/107 |
| 5,418,532 | 5/1995 | Lei | 341/107 |

*Primary Examiner*—Jeffrey A. Gaffin
*Assistant Examiner*—Jason L. W. Kost
*Attorney, Agent, or Firm*—Skjerven, Morrill, MacPherson, Franklin & Friel; Paul J. Winters; David T. Millers

[57] ABSTRACT

A coder/decoder selects one of a set of look-up tables for encoding/decoding a symbol. Each look-up table contains boundary values that result from an arithmetic coding model partitioning a first interval. A second interval contains an arithmetic code. During encoding, look-up table entries for a symbol value are converted to the scale of the second interval. The scaled values indicate a smaller interval containing the arithmetic code. Code bits are generated when most significant bits of upper and lower scaled values are equal. During decoding, a code word, which is a part of an arithmetic code, is normalized from the scale of the second interval to the scale for a look-up table and then compared to entries of the look-up table. When a segment containing the code word is identified, a decoded symbol value is known. A scaling circuit converts boundary values for the segment to the scale of the second interval then changes the second interval. Identical most significant bits in the boundary values are shifted out of a register to prevent overflow during encoding/decoding. To increase the effective size of the register, the next to most significant bit can be removed while a counter counts the number of bits removed.

16 Claims, 4 Drawing Sheets

SYNTAX BASED ARITHMETIC CODER AND DECODER

CROSS REFERENCE TO RELATED APPLICATION

This application is related to and incorporates by reference in its entirety U.S. patent application Ser. No. 08/359,241, filed Dec. 16, 1994, entitled "Syntax Based Arithmetic Coding for Low Bit Rate Videophone."

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

BACKGROUND OF THE INVENTION

1. Field of the Invention

This invention relates to variable length coding and circuits for coding and decoding of information using variable length codes.

2. Description of Related Art

Information can be transmitted or stored digitally as a series of bits. Often, the series of bits represents a string of symbols which is created and interpreted according to a predefined syntax for the information. According to the syntax, each symbol in the string has a fixed number of possible values or meanings. Fixed length coding represents the value of a symbol using a number of bits that is fixed for the symbol and independent of the symbol's value. For example, symbols having 256 possible values are typically represented by eight bits 00h to FFh. More or fewer bits may be used for symbols having more or fewer possible values.

Typically, the choice of syntax and the nature of the information represented cause some symbol values to occur more frequently than other symbol values. Variable length coding codes different values of a symbol using different numbers of bits. One well known variable length coding technique, commonly referred to as Huffman coding, matches each symbol value to a Huffman code in a table for the symbol. The most common symbol values have the Huffman codes with the fewest bits, and rarer symbol values have Huffman codes containing more bits. Replacing fixed length codes with Huffman codes reduces the average number of bits required to express strings of symbols.

Arithmetic coding is a variable length coding technique that uses an arithmetic coding model to encode a string of symbols. FIG. 1 illustrates an example of arithmetic coding. In the example, each symbol has six possible values {a, e, i, o, u, !}, and the string encoded is "eaii!". An arithmetic coding model divides an interval into segments which have lengths proportional to the probability of a symbol value occurring in a string. In FIG. 2, the probabilities for symbol values a, e, i, o, u, and ! are 20%, 30%, 10%, 20%, 10%, and 10%; and the model divides the interval [0,1) into segments [0,0.2), [0.2,0.5), [0.5,0.6), [0.6,0.8), [0.8,0.9), and [0.9,1.0) which correspond to symbol values a, e, i, o, u, and ! respectively.

To determine an arithmetic code for string "eaii" interval [0,1) is divided according to the model, and a segment [0.2,0.5) corresponding to symbol value e, the first symbol value in string eaii!, is selected. The selected segment is also an interval which contains the arithmetic code and is divided according to the model into segments [0.2,0.26), [0.26,0.35), [0.35,0.38), [0.38,0.44), [0.44,0.47), and [0.47,0.5) corresponding to symbol values a, e, i, o, u, ! respectively. The segment [0.2,0.26) corresponding to symbol value a, the second symbol value in string "eaii", is selected. Partitioning and selecting segments is repeated for symbol values i, i, and ! and results in selection of interval [0.23354,0.2336). Any value in interval [0.23354,0.2336) can be used as an arithmetic code which identifies string "eaii!". A preferred code requires the minimum number of bits to express. For the example, a code value 0.233581542 in interval [0.23354, 0.2336) is 0.0011101111011 binary.

Prior art arithmetic codes describe strings containing a single symbol type. When the syntax calls for a change of symbol type, coding is interrupted. Many syntaxes define many types of symbols, and each type of symbol has different statistics from the other types of symbols. The prior art has not provided a way to employ continuous arithmetic coding in applications such as moving image encoding where strings contain varied types of symbols having different ranges of possible values and different statistics.

SUMMARY OF THE INVENTION

In accordance with an embodiment of the invention, a coder or decoder includes a memory containing a set of look-up tables. Each look-up table corresponds to a different arithmetic coding model for a different type of symbol. A syntax decoder selects a look-up table to be used in encoding or decoding a symbol. This allows a string containing many types of symbols to be encoded into a single arithmetic code. An arithmetic code can have an extended length and be encoded or decoded as part of a seamless process for all symbol values produced by an information source.

In an embodiment of a coder in accordance with the invention, each look-up table in a memory indicates how a corresponding arithmetic coding model partitions a first interval into segments. For a symbol value to be encoded, the memory provides boundary values of a corresponding segment in the first interval. Registers in the coder store upper and lower boundary values of a second interval which contains the arithmetic code, and a scaling circuit converts boundary values from the memory to the scale of the second interval. The scaled boundary values replace the values stored in the registers and indicate the boundaries of a smaller second interval which contains the arithmetic code. Output code bits are generated when the most significant bits of the upper boundary value of the second interval are equal to the most significant bits of the lower boundary value of the second interval.

An embodiment of a decoder in accordance with the invention uses the look-up tables which are the same as look-up tables used by a coder. Registers in the decoder store the upper and lower boundary values of a second interval which contains the code value. Code bits to be decoded are accumulated into code words which are normalized from the scale indicated by the second interval to the scale used by the look-up tables. The normalized code words are compared to boundary values of segments indicated by a look-up table for the symbol being decoded. When a segment (and therefore a corresponding symbol value) is identified, a scaling circuit converts boundary values for the segment to the scale of the second interval, and the scaled boundary values replace the boundary values in the registers.

During arithmetic encoding or decoding, the size of the interval containing the arithmetic code decreases each time an arithmetic coding model selects a segment. Accordingly, as intervals become smaller, more bits are required to provide a fixed point representation of the boundary values. If a string or symbol values is long enough, the fixed point representation of the boundary values eventually exceeds the capacity of a finite size register. In accordance with an embodiment of the invention, most significant bits which are the same for both the upper and lower boundaries of an interval are shifted out of the registers which store the boundary values.

Additionally, when the two most significant bits of the upper boundary are 10b (binary) and the two most significant bits of the lower boundary are 01b, the second to the most significant bit is removed from each register that stores a boundary value. A counter counts the number of bits removed. Accordingly, when the counter contains a non-zero count and the registers contain a high value $1X_Hb$ and a low value $0X_Lb$, where $X_H$ and $X_L$b are "don't care" bits, the boundaries of the interval are $10\ldots0X_Hb$ and $01\ldots1X_Lb$. This effectively increases the number of significant bits usable in the encoding process, and allows encoding or decoding of long strings without overflowing the capacity of registers containing boundary values for the interval containing the arithmetic code.

BRIEF DESCRIPTION OF THE DRAWINGS

Use of the same reference symbols in different figures indicates similar or identical items.

DETAILED DESCRIPTION OF THE PREFERRED EMBODIMENTS

In accordance with an embodiment of this invention, coders and decoders use arithmetic coding to process strings containing a variety of symbol types which can have different coding models. The coding model employed for a particular symbol value is selected according to the syntax of the string. Coders and decoders in accordance with an embodiment of the invention include a memory containing a set of tables representing coding models employed in the encoding or decoding process. The table used for encoding or decoding a value for a particular symbol is selected according the syntax of the string.

Figure 1:
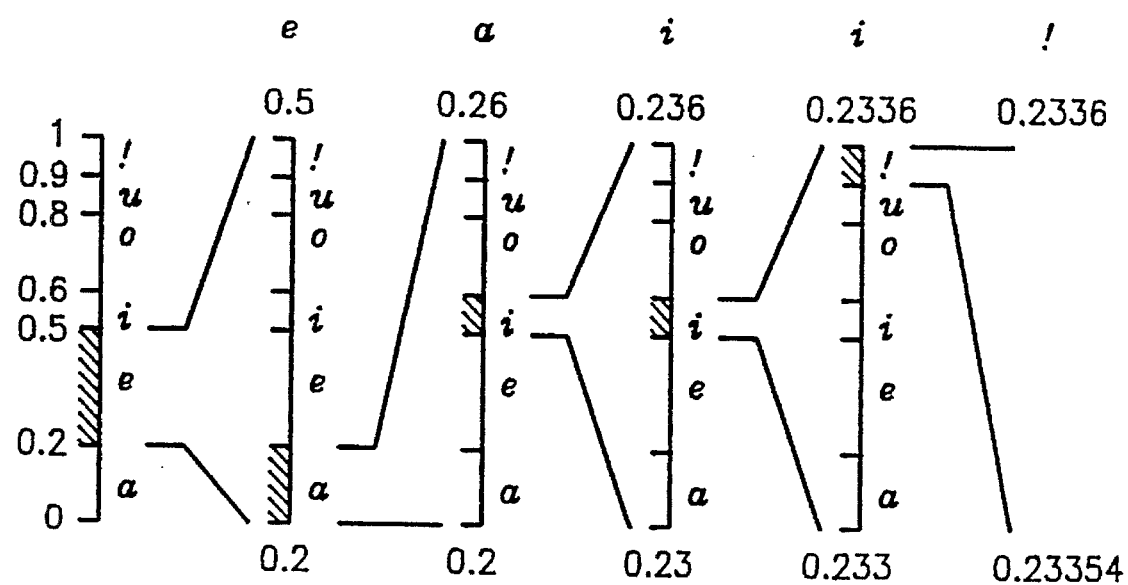
FIG. 1 illustrates a prior art process for arithmetic coding of a string of symbol values.
Figure 2:
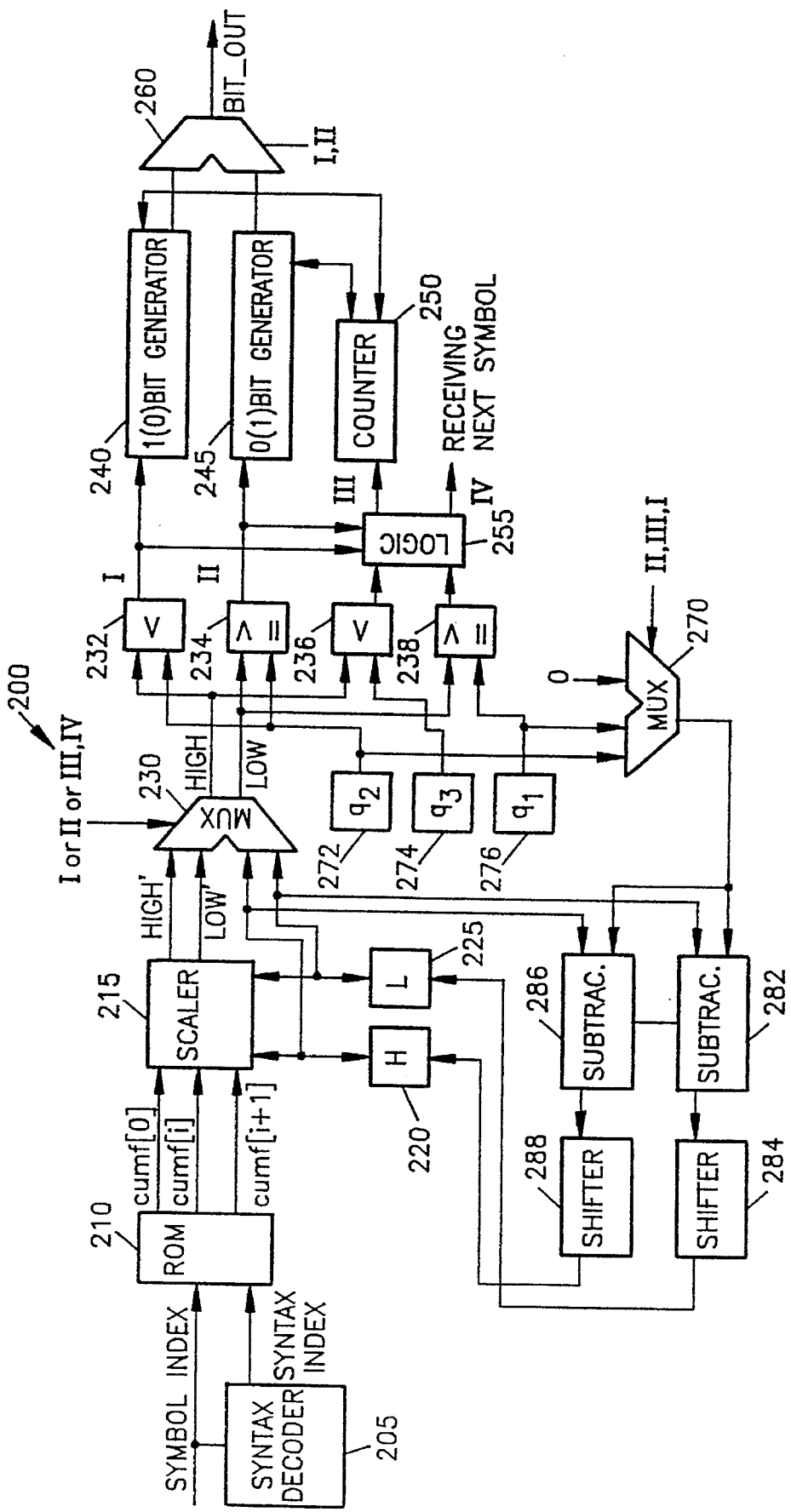
FIG. 2 is a block diagram of an embodiment of a coder in accordance with the invention.

FIG. 2 shows a coder 200 in accordance with an embodiment of the invention. Coder 200 includes a memory 210 which contains tables representing arithmetic coding models, registers 220 and 225 which indicate the upper and lower boundaries of an interval containing the arithmetic code, a scaling circuit 215 which determines the boundaries of a segment in the interval, and bit generators 240 and 245 which generate output signal BIT_OUT from coder 200.

To start decoding a string, registers 220 and 225 are loaded with values HIGH and LOW which indicate the upper an lower boundaries of an interval to contain the generated arithmetic code. This interval is successively partitioned by arithmetic coding models to provide smaller intervals which contain the code value. Initial values HIGH and LOW are preferably the highest and lowest values that registers 220 and 225 can store. For example if registers 220 and 225 are 16-bit data storage locations, the initial values HIGH and LOW are FFFFh and 0000h (hexadecimal).

A signal IV is set high to start coder 200 encoding a symbol value from a string. Coding a symbol value starts when an address signal indicating a syntax index and a symbol index is asserted to memory 210. The syntax index selects a look-up table representing an arithmetic coding model for a symbol, and the symbol index selects entries corresponding to the symbol value from the selected look-up table. Memory 210 would typically be a non-volatile memory such as a ROM, EPROM, EEPROM, or flash memory which contains a look-up table for each type of symbol encoded by coder 200, but alternatively memory 210 can be a volatile memory such as SRAM or DRAM which is changed or updated during the coding. The look-up tables in memory 210 contain entries which indicate how a coding model partitions an interval into segments.

A syntax decoder 205 generates the syntax index which selects the look-up table used. In one embodiment, syntax decoder 205 is a state machine which sets and changes the syntax index according a predefined syntax for the string of symbols. Alternatively, a microprocessor or a microcontroller executing software generates the syntax index required to select a look-up table.

The symbol index indicates a symbol value from an information source. The information source can be any source of symbol values. One example application of coder 200 is in a video codec where a string of symbol values indicate pixel values, motion vector components, DCT coefficients, and the starts of frames, macro blocks, and intra blocks. A syntax for a video codec is described in NTR "Video Codec Test Model, TMN4 Rev1" *ITU Telecommunication Standardization Sector, Study Group* 15, *Working Party* 15/1, *LBC*-94-, Oct. 25, 1994 which is incorporated by reference here in its entirety.

In response to the address signal, memory 210 outputs to scaling circuit 215, signals indicating entries cumf[0], cumf[i], and cumf[i+1] from the look-up table selected by the syntax index. Entries cumf[i] and cumf[i+1] are the upper and lower boundaries of a segment in the interval [0, cumf[0]], corresponding to the symbol value indicated by symbol index i. Scaling circuit 215 transforms entries cumf[i] and cumf[i+1] to values indicating the boundaries of a segment in the interval bounded by values HIGH and LOW. Scaling circuit 215 generates new values HIGH' and LOW' according to equations (1) and (2).

$$\text{HIGH'}=\text{LOW}+\{((\text{LENGTH}*\text{cumf}[i]/\text{cumf}[0]\}-1 \quad (1)$$

$$\text{LOW'}=\text{LOW}+\{((\text{LENGTH}*\text{cumf}[i+1]/\text{cumf}[0]\} \quad (2)$$

where value LENGTH is HIGH–LOW+1. Scaling circuit 215 outputs values HIGH' and LOW' to a multiplexer 230. Values HIGH' and LOW' from scaling circuit 215 replace values HIGH and LOW in registers 220 and 225.

With signal IV set, values from scaling circuit 215 pass through multiplexer 230, and are asserted to comparators 232, 234, 236, and 238. Comparators 232, 234, 236, and 238 operate in parallel and compare values HIGH and LOW to values q1, q2, and q3 which are stored in registers 272, 274, and 276. Values q1, q2, and q3 have binary forms $010\ldots0b$, $10\ldots0b$, and $110\ldots0b$, respectively, where the number of bits in each of values q1, q2, and q3 matches the number of bits for values HIGH and LOW. Comparator 232 sets a signal I if value HIGH is less than value q2. Comparator 234 sets a signal II if value LOW is greater than or equal to value q2. Comparator 236 determines whether value HIGH is less than value q3, and comparator 238 determines whether value LOW is greater than or equal to value q1.

Signal I being high enables bit generator 240 which generates a bit with value 0 followed by a series of bits with value 1. A counter 250 indicates the number of bits with value 1 in the series and is described below. If counter 250 stores value 0, then bit generator 240 generates a single bit with value 0. Signal I being high indicates value HIGH (the upper boundary) is less than q2 and therefore has a most significant bit (MSB) which is zero. Value LOW (the lower boundary) must also have a MSB which is zero. Accordingly, all values in the interval containing the arithmetic code have this bit equal to zero, and a zero-valued code bit is immediately transmitted through a multiplexer 260.

Signal I also causes a multiplexer 270 to assert value 0 to subtractors 282 and 286. Subtractors 282 and 286 pass values HIGH and LOW to shifters 284 and 288. Shifter 288 shifts value HIGH left one bit, inserts a 1 as the least significant bit, and then stores the result in register 220. This provides a new value HIGH. Shifter 284 shifts value LOW left, inserts a 0 as the least significant bit, and stores the result in register 225. Each left shift removes a most significant bit which is not needed for determination of subsequent code bits. This reduces round off error due to the finite precision of arithmetic operations and prevents registers 220 and 225 from filling with MSBs that do not affect subsequent code bit generation.

Signal II being set enables bit generator 245 which generates a bit with value 1 followed by a series of bits with value 0. Counter 250 indicates the number of bits with value 0. If counter 250 stores value 0, then bit generator 240 generates a single bit with value 1. Signal II being high indicates value LOW is greater than or equal to value q2 and therefore has an MSB which is 1. Value HIGH must also have a MSB which is 1. Accordingly, the code is in an interval in which all values have this bit equal to 1, and a code bit with value 1 is transmitted through multiplexer 260.

Signal II also causes a multiplexer 270 to assert value q2 to subtractors 282 and 286 which subtract value q2 from each of values HIGH and LOW. Shifter 288 shifts the difference between values HIGH and q2 left and inserts a 1 as the least significant bit of the result. Shifter 284 shifts the difference between values LOW and q2 left and inserts a 0 as the least significant bit of the result. The results, new values HIGH and LOW, from shifter 288 and 284 are stored in registers 220 and 225.

Combinatorial logic 255 sets a signal III if value LOW is less than value q2 but not less than value q1, and value HIGH is not less than value q2 but is less than value q3. Signal III increments counter 250. If signal III is set, then values HIGH and LOW have binary forms $10X_H b$ and $01Xnb$ respectively, where $X_H$ and $X_L$ can be any binary sequence. Signal III being high causes multiplexer 260 to assert value q1, 010 . . . 0b, to subtractors 286 and 282 which subtract q1 from values HIGH and LOW. The results of the subtractions have binary form $01X_H b$ and $00X_L b$. Shifters 288 and 284 convert these values to $1X_H 1b$ and $0X_L 0b$. As a result, the next to most significant bit is removed from values HIGH and LOW. However, the MSB indicates the value of the bit removed. If the MSB is 0, the removed bit was 1. If the MSB is 1, the removed bit was 0. The count in counter 250 indicates the number of bits removed. In subsequent encoding, when signal I or II is set, the MSB for the arithmetic code is known, and bit generator 240 or 245 generates a series of ones or zeros to replace the bits removed. Counter 250 is reset to zero after the series of code bits is generated.

If any of signals I, II, or III is set, multiplexer 230 cycles values HIGH and LOW (after being shift by shifter 284 or 286) from registers 220 and 225 to comparators 232, 234, 236, and 236. Further code bits are generated if the new values HIGH and LOW cause signal I or II to be set, and further bits are removed from registers 220 and 225 if the bits are not required for further calculation. Cycling values HIGH and LOW through comparators 232, 234, 236, and 238 repeats until combinatorial logic 255 sets signal IV. Signal IV is set if none of signals I, II, or III are set. When signal IV is set, no subtraction from or shift of values HIGH and LOW occurs; and the next values HIGH and LOW are from scaling circuit 215 and depend on the symbol and syntax indices asserted to memory 210.

Figure 3:
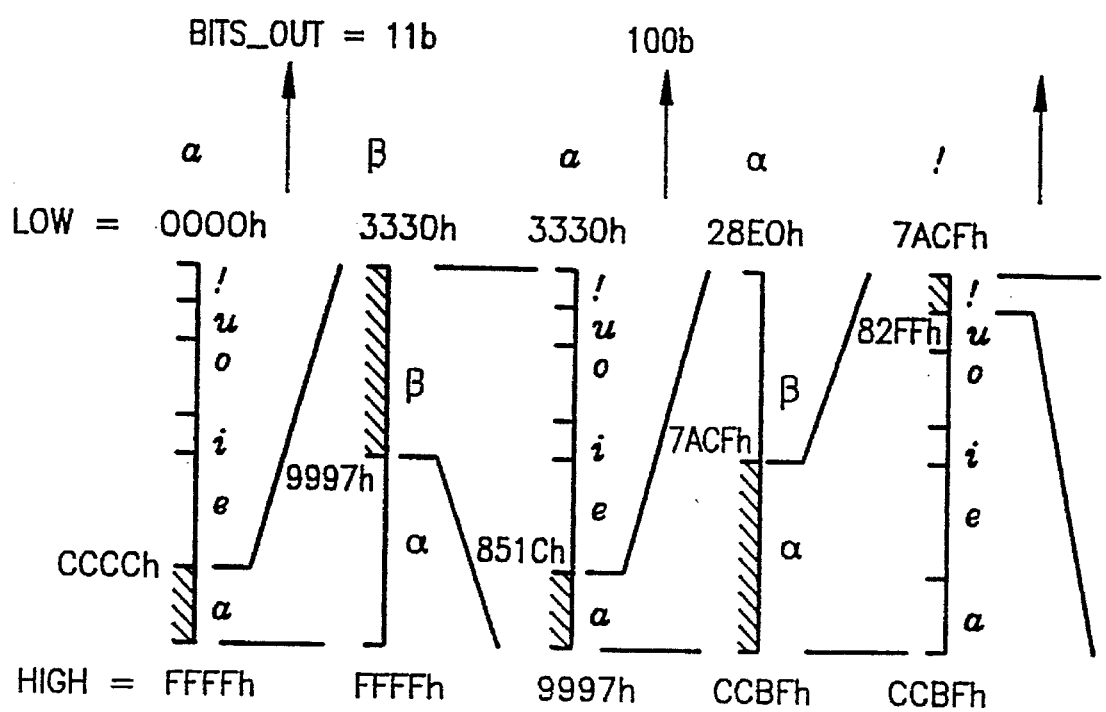
FIG. 3 illustrates an encoding process in accordance with an embodiment of the invention.

An example process for syntax based coding of a string of symbol values that begins with values "αβαα!" is illustrated in FIG. 3 and described in conjunction with coder 200 of FIG. 2. The syntax for the first five symbols defines alternating occurrences of symbols of first and second types. Table 1 shows a look-up table for the first type of symbol which has six possible values a, e, i, o, u, and !. The probability of finding value a, e, i, o, u, or ! in a string is 20%, 30%, 10%, 20%, 10%, or 10% respectively.

TABLE 1

Example First Type of Symbol

| Symbol Index | Symbol Value | Boundary Value cumf[x] |
|---|---|---|
| 0 | a | 65,535 (FFFFh) |
| 1 | e | 52,428 (CCCCh) |
| 2 | i | 32,767 (7FFFh) |
| 3 | o | 26,214 (6666h) |
| 4 | u | 13,107 (3333h) |
| 5 | ! | 6,553 (1999h) |
| 6 | none | 0 (0000h) |

Table 1 indicates boundaries of segments which partition the interval [0, 65536) or [0, 65535]. Each possible symbol value corresponds to a segment having a length proportional to the probability of the symbol having that symbol value. An entry in the table at an address indicated by the symbol index for the symbol value indicates the upper boundary of each segment. The lower boundary of each segment is the entry for the next symbol index.

Table 2 shows an example look-up table for the second type of symbol which has two possible symbol values α and β where each values α and β is equally likely to appear in a string.

TABLE 2

Example Second Type of Symbol

| Symbol Index | Symbol Value | Boundary Value cumf[x] |
|---|---|---|
| 0 | α | 65,535 (FFFFh) |
| 1 | β | 32,767 (7FFFh) |
| 2 | none | 0 (0000h) |

Registers 220 and 225 are initialized with values FFFFh and 0000h respectively. Signal IV is set, and an address signal, syntax and symbol index, is asserted to memory 210. For symbol value a, memory 210 asserts entries cumf[0], cumf[0], and cumf[1] from Table 1 to scaling circuit 215. Since the interval defined by values HIGH and LOW is the same as the interval for Table 1, values HIGH' and LOW' from scaling circuit 215 equal FFFFh and CCCCh, cumf[0] and cumf[1]. Values FFFFh and CCCCh are written to registers 220 and 225 and pass through multiplexer 230 to comparators 232, 234, 236, and 238. Signal II is set because the MSB of both FFFFh and CCCCh is 1. Bit generator 245 generates a code bit value 1, and shifters 288 and 284 shift values FFFFh and CCCCh to FFFFh and 9998h which are written to registers 220 and 225.

Values FFFFh and 9998h pass through multiplexer 230 because signal II was set. Signal II is set again, and bit generator 245 generates second code bit with value 1. Shifters 288 and 284 shift values FFFFh and 9998h to FFFFh and 3330h which are again stored in registers 220 and 225 and cycled through multiplexer 230. In the third cycle through multiplexer 230, signal IV is set indicating coder 200 is ready for the next symbol value.

A syntax index selecting Table 2 and a symbol index 1 for the second symbol value β is asserted to memory 210. Memory 210 asserts values 0 and 7FFFh to scaling circuit 215 which after scaling for interval [3330h, FFFFh] sets values HIGH and LOW to 9997h and 3330h. Combinatorial logic 255 sets signal IV, and no output bits are generated.

A syntax index selecting Table 1 and a symbol index 0 for the third symbol value a is asserted to memory 210. Memory 210 asserts values FFFFh and CCCCh to scaling circuit 215 which after scaling for interval [3330h, 9997h] sets values HIGH and LOW to 9997h and 851Ch. Comparator 234 sets signal II, and bit generator 245 generates an output bit with value 1. Shifters 284 and 288 convert values HIGH and LOW to 332Fh and 0A38h which pass through multiplexer 230. Comparator 232 sets signal I, and bit generator 240 generates an output bit with value 0. Values HIGH and LOW become 665Fh and 1470h and pass through multiplexer 230. In the third cycle through multiplexer 230, signal I is set again and another output bit with value 0 is generated. Values HIGH and LOW become CCBFh and 28E0h and pass through multiplexer 230. In a fourth cycle, signal IV is set.

A syntax index selecting Table 2 and a symbol index 0 for the fourth symbol value α is asserted to memory 210. Memory 210 asserts values 7FFFh and FFFFh to scaling circuit 215 which after scaling for interval [28E0h, CCBFh] sets values HIGH and LOW to 7ACFh and CCBFh. Combinatorial logic 255 sets signal IV.

A syntax index selecting Table 1 and a symbol index 5 for the symbol value ! is asserted to memory 210. Memory 210 asserts values 1999h and 0000h to scaling circuit 215 which after scaling for interval [7ACFh, CCBFh) sets values HIGH and LOW to 7ACFh and 82FFh. Combinatorial logic 255 sets signal III which causes counter 250 to increment to 1. Values HIGH and LOW become 759Eh and 85FFh. Values HIGH and LOW cycle through multiplexer 230 three more times. Each time signal III is set. A fifth cycle sets signal IV when counter 250 contains a count equal to 4, and values HIGH and LOW are 2CF0h and AFFFh. Bit generator 240 or 245 transmits the four removed bits the next time signal I or II is set.

A string of symbol values can be encoded as a continuous stream of bits without breaks for different types of symbol values. However, a string of symbols can be broken into pieces, each of which has a separate arithmetic code. For example, in video encoding, each frame of a moving image can be encoded as a separate arithmetic code. In one embodiment of the invention, syntax decoder 205 identifies a last symbol value in a representation of a frame and after encoding the last symbol value flushes encoder 200. To flush encoder 200, counter 250 is incremented, and then if value LOW is less than value q1, bit generator 245 generates a bit with value 0 followed by a series of bits with value 1. If value LOW is not less than value q1 when encoder 200 is flushed, counter 250 is incremented then bit generator 240 generates a bit with value 1 followed by a series of bits with value 0. Flushing encoder 200 ensures that bits required to identify the last code transmitted. After flushing, encoder 200 is initialized for a next arithmetic code.

Figure 4:
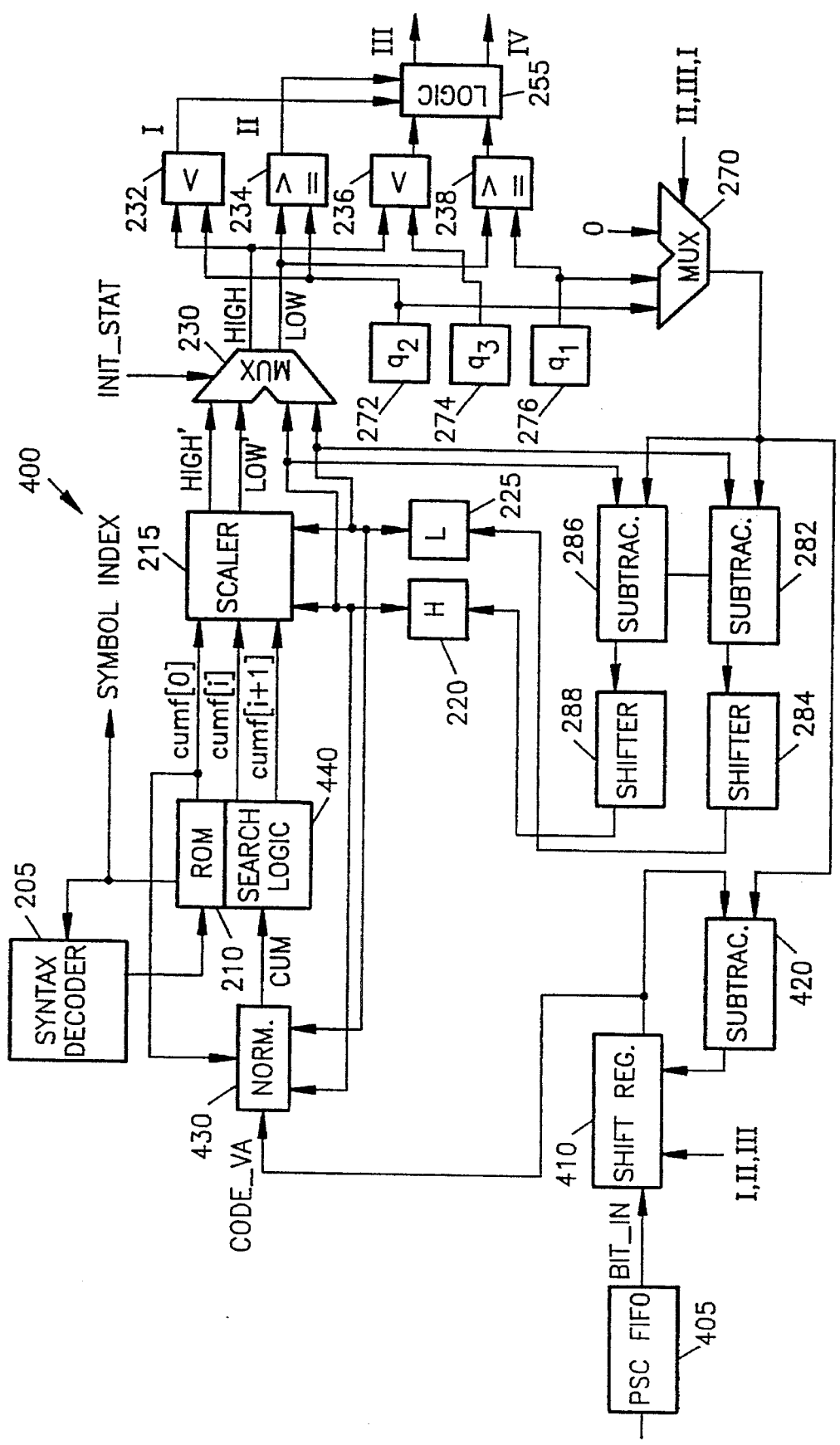
FIG. 4 is a block diagram of an embodiment of a decoder in accordance with the invention.

FIG. 4 shows a block diagram of a decoder 400 in accordance with an embodiment of the invention. Decoder 400 receives a stream of bits to be decoded into a string of symbol values. A FIFO buffer 405 stores the bits received from the stream and fills a shift register 410. Once a full word of bits is accumulated from signal BIT_IN, shift register 410 transmits a code word CODE_VA to a normalizing circuit 430. In accordance with the one embodiment, words contain 16-bits but alternatively words of any size may be employed.

Normalizing circuit 430 converts code word CODE_VA, which is in the interval between values HIGH and LOW, to a normalized value CUM at a proportionate location in an interval used by the look-up table describing an arithmetic coding model. In one embodiment, value CUM is given by $$CUM=((CODE\_VA-LOW+1)*CUMF[0]-1)/LENGTH$$

where value LENGTH is (HIGH-LOW+1) and CUMF[0] is the size of the interval used by the look-up table. Look-up tables for decoding are identical to the look-up tables for encoding. In an embodiment where decoder 400 is part of a codec, a single memory 210 can be used for both coding and decoding. Registers 220 and 225 are initialized in the same manner as in coder 200, for example with values HIGH and LOW equal to FFFFh and 0000h.

Normalizing circuit 430 transmits normalized value CUM to search logic 440 which searches the selected look-up table in memory 210 to find a segment containing normalized value CUM. The resulting symbol index for the segment indicates a decoded symbol value and is output from decoder 400. A syntax decoder 205 receives the output symbol index and can use decoded symbol indices to select the look-up tables subsequently searched.

Once the symbol index is found, search logic 440 causes memory 210 to assert values CUMF[0], CUMF[1], and CUMF[i+1] to a scaling circuit 215. Scaling circuit 215, multiplexer 230, registers 272, 274, and 276, comparators 232, 234, 236, and 238, and logic circuit 255 function as described above in regard to decoder 200 of FIG. 2 and set one of signals I, II, III, and IV according to values HIGH and LOW. As described above, signals I, II, and III control how subtractors 282 and 286 and shifters 284 and 288 transform values HIGH and LOW in registers 220 and 225. Decoder 400 changes values HIGH and LOW in the same manner as described above for coder 200 of FIG. 2. Accordingly, during decoding, decoder 400 generates the same values HIGH and LOW as did coder 200 during encoding.

A subtractor 420 and shift register 410 change the value in shift register 410 in a manner that parallels the changes in values HIGH and LOW. If signal I or II is set, shift register 410 performs a logical shift left and thereby removes the most significant bit of the accumulated bits. If signal III is set, subtractor 420 subtracts 01b from the two most significant bits in shift register 410, and shift register 410 shifts the difference one bit to the left, thereby removing the second to the most significant bit. When performing a shift, shift register 410 inserts a bit from FIFO 405 as the least significant bit. The value in shift register 410 continues to change as values HIGH and LOW cycle through multiplexer 230.

Signal IV is set to indicate that the changes in values HIGH, LOW, and shift register 410 are complete. Shift register 410 asserts a new value for word CODE_VA to normalizing circuit 430 when signal IV is set, and search logic 440 determines a next symbol index in the same manner as the first symbol index was determined.

Decoding can be continuous where a single arithmetic code indicates all symbol values or discontinuous where several separate arithmetic codes indicate the symbol values. In the discontinuous case, syntax decoder 205 identifies the end of an arithmetic code by identifying a last symbol, such as an end-of-frame symbol, defined by the syntax for the information being decoded. For the last symbol, word CODE_VA may contain invalid bits which are not from signal BIT_IN. However, the invalid bits do not effect decoding since the bits from signal BIT_IN are sufficient to identify the last symbol, and decoder 400 reinitializes after the last symbol.

Appendix A contains a C language source code listing of a procedure en_a_symbol and a function de_a_symbol. Procedure en_a_symbol encodes a symbol value represented a symbol index "symbol" and an arithmetic coding model represented by a matrix (look-up table) cumf[]. Function de_a_symbol decodes a symbol value using an arithmetic coding model represented by a matrix (look-up table) cumf[]. In Appendix A, routines for input and output of code bits are indicated by pseudo code to send a bit to or get a bit from a FIFO buffer PSC_FIFO.

Appendix B contains a VHDL description of embodiments of a coder enc and a decoder dec. Software is commercially available, for example from Viewlogic, Inc. of Marylborow, Mass. and Cadence, Inc. of San Jose, Calif., which can convert such VHDL descriptions into circuit layouts.

Although the present invention is described with reference to particular embodiments, the description is only an example of the invention's application and should not be taken as a limitation. Various adaptations and combinations of features of the embodiments disclosed will be apparent to those skilled in the art and are within the scope of the present invention as defined by the following claims.

APPENDIX A

```
#define top 65535
#define q1 16384
#define q2 32768
#define q3 49152
#define max_freq 16383
static long low, high, opp_bits, length;
void en_a_symbol(int symbol, int cumf[])
{   length = high - low + 1;
    high = low - 1 + (length*cumf[symbol])/cumf[0];
    low += (length*cumf[symbol+1])/cumf[0];
    for(;;){
        if(high < q2) { send out a bit 0 to PSC_FIFO;
           while(opp_bits>0){ send out a bit 1 to
           PSC_FIFO; opp_bits--; } }
        else if(low >= q2) {
          send out a bit 1 to PSC_FIFO;
          while(opp_bits > 0){
             send out a bit 0 to PSC_FIFO; opp_bits--; }
          low -= q2; high -= q2; }
        else if(low >= q1 && high < q3){
          opp_bits += 1; low -= q1; high -= q1; }
        else break;
        low *= 2; high = 2*high+1; }
} static long low, high, code_va, bit, length, symbol, cum;
int de_a_symbol(int cumf[])
{   length = high - low + 1;
    cum = (-1 + (code_va-low+1)*cumf[0])/length;
    for(symbol = 1; cumf[symbol] > cum; symbol++);
    high = low - 1 + (length*cumf[symbol-1])/cumf[0];
    low += (length*cumf[symbol])/cumf[0];
    for(;;){
        if(high < q2) ; else if(low >= q2){
```

```
            code_va -= q2; low -= q2; high -= q2; }
         else if(low >= q1 && high < q3){
            code_va -= q1; low -= q1; high -= q1; }
         else break;
5        low *= 2; high = 2*high + 1;
         get bit from PSC_FIFO;
         code_va = 2*code_va + bit; }
      return (symbol-1);
   }
```

APPENDIX B

```
entity enc is
    generic(buf_delay, handshake_delay : time :=10 ns);
    port(signal low,high,opp_bits: inout vlbit_1d(0 to
31):="00000000000000000000000000000000";
        signal q,max_freq : inout vlbit_1d(0 to 31);
        signal res:inout vlbit_1d(0 to 32):=
"000000000000000000000000000000000";
        signal resi:inout vlbit_1d(0 to 33):=
"0000000000000000000000000000000000";
        signal resj:inout vlbit_1d(0 to 63);
        signal length,qone,qtwo,qthree,qp,qq,cum,tempi,
temp:inout vlbit_1d(0 to 31):=
"00000000000000000000000000000001";
        signal psc_fifo: inout vlbit; signal done: inout
vlbit:='0';
        signal symbol,temp3: inout vlbit_1d(3 downto 0));
    end enc;

architecture behavior of enc is
    begin
        init: process
        type WORD is array (3 downto 0) of vlbit;
        type MEMORY is array (0 to 15) of WORD:
        variable cumf: MEMORY;
    begin
        --length=high-low+1
        res<=subum(high,low);
        resi<=addum(res,temp);
        length<=resi(0 to 31);
        -- high=low-1+1(length*cumf[symbol])/cumf[0];
        res<=subum(low,temp);
        cum<=cumf(vld2int(symbol));
        resj<=mulum(length,cum);
        cum<=cumf(vld2int(temp3));
        resi<=resj(0 to 32);
```

```
         resi<=divum(resi,cum);
         high<=resi(0 to 31);
         resi<=addum(res,high);
         high<=resi(0 to 31);
 5       --low +=(length*cumf[symbol+1])/cumf(0)
         res<=addum(symbol,temp);
         qp<=res(0 to 31);
         cum<=cumf(vld2int(qp));
         resj<=mulum(length,cum);
10       qq<=resj(0 to 31);
         cum<=cumf(vld2int(temp3));
         resi<=divum(qq,cum);
         qq<=resi(0 to 31);
         low<=addum(qq,low);
15       while done='0' loop
           if vld2int(high) < vld2int(qtwo) then
              psc_fifo<='0';
              while(vld2int(opp_bits) > 0) loop
                 psc_fifo<='1';
20               res<=subum(opp_bits,temp);
                 opp_bits<=res(0 to 31);
              end loop;
           elsif vld2int(low)>=vld2int(qtwo) then
              psc_fifo<='1';
25            while (vld2int(opp_bits) > 0) loop
                 psc_fifo <= '0';
                 res<=subum(opp_bits,temp);
                 opp_bits<=res(0 to 31);
              end loop;
30            resi<=subum(low,qtwo);
              low<=resi(0 to 31);
              resi<=subum(high,qtwo);
              high<=resi(0 to 31);
           elseif vld2int(low) >= vld2int(qone) and
35   vld2int(high) < vld2int(qthree) then
              res<=addum(opp_bits,temp);
```

```
            opp_bits<=res(0 to 31);
            resi<=subum(low,qone);
            low<=resi(0 to 31);
            resi<=subum(high,qone);
            high<=resi(0 to 31);
          else
            exit;
          resj<=mulum(low,tempi);
          low<=resj(0 to 31);
          resj<=mulum(high,tempi);
          high<=resj(0 to 31);
          resi<=addum(high,temp);
          high<=resi(0 to 31);
        end if;
    end loop;
  end process init;
end behavior;

entity dec is
    generic(buf_delay, handshake_delay : time :=10 ns);
    port(signal low,high,opp_bits; inout vlbit_1d(0 to 31);
    signal qone,qtwo,qthree,q,max_freq,code_va : inout vlbit_1d(0 to 31);
    signal res:inout vlbit_1d(0 to 32):=
"00000000000000000000000000000000";
    signal resi:inout vlbit_1d(0 to 33):=
"00000000000000000000000000000000";
    signal resj:inout vlbit_1d(0 to 63);
    signal length,qp,qq,cum,tempi,temp:inout vlbit_1d(0 to 31):="00000000000000000000000000000001";
    signal psc_fifo,flag: inout vlbit:='0';signal done: inout vlblt:='0';
    signal symbol,temp3; inout vlbit_1d(31 downto 0));
end dec;
```

```
    architecture behavior of dec is
      begin
        init: process
        type WORD is array (31 downto 0) of vlbit;
 5      type MEMORY is array (0 to 15) of WORD;
        variable cumf: MEMORY;
        variable cumm: integer:=1;
      begin
            --length=high-low+1;
10          res<=subum(high,low);
            resi<=addum(res,temp);
            length<=resi(0 to 31);
            -- cum=(-1+(code_va-low+1)*cumf[0])/length;
            res<=subum(code_va,low);
15          resi<=addum(res,temp);
            qp<=resi(0 to 31);
            cumm:=vld2int(temp);
            resj<=mulum(qp, cumf(cumm));
            qp<=resj(0 to 31);
20          qq<=divum(qp,length);
            res<=subum(qq,temp);
            cum<=res (0 to 31);
         symbol<=temp;        -- initialize symbol to 1
         cumm:=vld2int(symbol);
25       while flag='1' loop
            -- high=low-1+(length*cumf[symbol-1])/cumf[0]
            res<=subum(symbol,temp);
            qp<=res(0 to 31);
            resj<=mulum(length,qp);
30          qp<=resj (0 to 31);
            qq<=cumf(vld2int(tempi));
            high<=divum(qp,qq);
            qp<=high;
            res<=addum(qp,temp);
35          qq<=res(0 to 31);
            res<=subum(low,qq);
```

```
              cumm:=cumm+1;
              if vld2int(cumf(cumm))>vld2int(cum) then
                 flag<='1';
              end if;
5          end loop;
        -- low += (length*cumf[symbol])/cumf[0]
           cumm: =vld2int(symbol);
           qp<=cumf(cumm);
           resj<=mulum(qp,length);
10         qp<=resj(0 to 31);
           qq<=cumf(0);
           q<=divum(qp,qq);
           res<=addum(q,low);
           low<=reg(0 to 31);
15         while done='0' LOOP
              if vld2int(high) < vld2int(qtwo) then
                 null;
                 elsif vld2int(low)>=vld2int(qtwo) then
                    res<=subum(code_va,qtwo);
20                  code_va<=res(0 to 31);
                    resi<=subum(low,qtwo);
                    low<=resi(0 to 31);
                    resi<=subum(high,qtwo);
                    high<=resi(0 to 31);
25            elsif vld2int(low) >= vld2int(qone) and
        vld2int(high) < vld2int(qthree) then
                    res<=subum(code_va,qone);
                    code_va<=res (0 to 31);
                    resi<=subum(low,qone);
30                  low<=resi(0 to 31);
                    resi<=subum(high,qone);
                    high<=resi(0 to 31);
              else
              exit;
35            resj<=mulum(low,tempi);
              low<=resj (0 to 31);
```

```
            resj<=mulum(high,tempi);
            high<=resj(0 to 31);
            resi<=addum(high,temp);
            high<=resi(0 to 31);
  5         res<=subum(code_va,tempi);
            qp<=res(0 to 31);
            res<=subum(qp,temp);
            code_va<=res(0 to 31);
               end if:
 10       end LOOP;
       end process init;
    end behavior;
```

We claim:

1. A coder comprising:

a memory which, in response to receiving a symbol index, asserts a signal that indicates the boundaries of a segment that corresponds to the symbol index and results from applying an arithmetic coding model to a first interval;

a register which indicates the boundaries of a second interval;

a scaling circuit coupled to the memory and the register, wherein the scaling circuit transforms the signal asserted by the memory to first and second digital signals indicating the boundaries of a segment of the second interval; and a signal generator which generates an output bit when a most significant bit of the first digital signal equals a most significant bit of a second digital signal.

2. The coder of claim 1, wherein the scaling circuit is coupled to write first and second digital values represented by the first and second digital signals in the register, and the coder further comprises:

a first comparator which is coupled to the scaling circuit and tests the most significant bit of the first digital signal;

a second comparator which is coupled to the scaling circuit and tests the most significant bit of the second digital signal; and a shift circuit operably coupled the first and second comparators and to the register, wherein the shift circuit left shifts each of the first and second digital values in response to the first comparator indicating the most significant bit of the first digital signal is 1 or the second comparator indicating the most significant bit of the second digital signal is 0.

3. The coder of claim 2, further comprising:

a third comparator coupled to the scaling circuit to compare two most significant bits of the first digital signal to 01b; and a fourth comparator coupled to the scaling circuit to compare two most significant bits of the second digital signal to 10b, wherein the shift circuit removes a next to the most significant bit from each of the first and second digital values in response to the third comparator indicating the two most significant bits of the first digital signal are 01b and the fourth comparator indicating the two most significant bits of the second digital signal are 10b.

4. The coder of claim 3, wherein the signal generator further comprises:

a first bit generator which is coupled to the first comparator and generates a bit having value 1 in response to the first comparator indicating the first digital signal has a most significant bit with value 1;

a second bit generator which is coupled to the second comparator and generates a bit having value 0 in response to the second comparator indicating the second digital signal has a most significant bit with value 0; and a counter operably coupled to the third and fourth comparators and to the first and second bit generators, wherein the counter increments a count each time the shift circuit removes the next to most significant bit from the first digital signal, wherein after generating a bit having value 1, the first bit generator generates a series of bits having value 0, the number of bits in the series being equal to the count in the counter; and after generating a bit having value 0, the second bit generator generates a series of bits having value 1, the number of bits in the series being equal to the count in the counter.

5. The coder of claim 1, wherein the scaling circuit is coupled to write first and second digital values represented by the first and second digital signals in the register, and the coder further comprises:

a first comparator coupled to the scaling circuit to compare two most significant bits of the first digital signal to 01b;

a second comparator coupled to the scaling circuit to compare two most significant bits of the second digital signal to 10b; and a shift circuit operably coupled the first and second comparators and to the register, wherein the shift circuit removes a next to the most significant bit from each of the first and second values in response to the first comparator indicating the two most significant bits of the first digital signal are 01b and the second comparator indicating the two most significant bits of the second digital signal are 10b.

6. The coder of claim 1, wherein the memory stores a plurality of look-up tables each of which corresponds to a different arithmetic coding model and has an address port adapted for receiving a syntax index which selects one of the look-up tables and the symbol index which selects an entry from the selected look-up table.

7. The coder of claim 6, further comprising a syntax decoder which is coupled to the memory and generates the syntax index.

8. A decoder comprising:

a memory which stores a look-up table having entries that indicate the boundaries of segments that result from applying an arithmetic coding model to a first interval;

a register which indicates the boundaries of a second interval;

a buffer for storing a code word having a value within the second interval;

a normalizing circuit coupled to the buffer and the register, wherein the normalizing circuit transforms the code word from the buffer into a normalized value which is within the first interval; and search logic coupled to the normalizing circuit and the memory, wherein the search logic locates entries of the look-up table which indicate a segment containing the normalized value and asserts a signal indicating a symbol value corresponding to the entry.

9. The decoder of claim 8, further comprising:

a scaling circuit coupled to the memory and the search logic to receive a signal which indicates boundaries of the segment containing the normalized value, wherein the scaling circuit transforms the signal to first and second digital signals indicating the boundaries of a second segment of the second interval, the scaling circuit being coupled to write first and second digital values represented by the first and second digital signals in the register;

a first comparator which is coupled to the scaling circuit and tests the most significant bit of the first digital signal;

a second comparator which is coupled to the scaling circuit and tests the most significant bit of the second digital signal; and a shift circuit operably coupled the first and second comparators and to the register, wherein the shift circuit left shifts each of the first and second values in response to the first comparator indicating the most significant bit of the first digital signal is 1 or the second comparator indicating the most significant bit of the second digital signal is 0.

10. The decoder of claim 9, further comprising:

a third comparator coupled to the scaling circuit to compare two most significant bits of the first digital signal to 01b; and a fourth comparator coupled to the scaling circuit to compare two most significant bits of the second digital signal to 10b, wherein the shift circuit removes a next to the most significant bit from each of the first and second values in response to the third comparator indicating the two most significant bits of the first digital signal are 01b and the fourth comparator indicating the two most significant bits of the second digital signal are 10b.

11. The decoder of claim 8, wherein:

the memory stores a plurality of look-up tables each of which corresponds to a different arithmetic coding model; and the coder further comprises a syntax decoder coupled to the memory to select the look-up table searched by the search logic.

12. A method for transmitting information, comprising:

asserting to a memory an address signal which corresponds to a symbol value;

generating, from the memory, a signal representing boundary values of a first segment of a first interval, wherein the first segment corresponds to the symbol value and results from applying an arithmetic coding model to the first interval;

storing, in a register, boundary values for a second interval;

converting the signal to a first digital signal and a second digital signal which respectively indicate first and second scaled values which are in the second interval; and transmitting a bit signal having a value equal to a most significant bit of the first digital signal when the most significant bit of the first digital signal equals a most significant bit of the second digital signal.

13. The method of claim 12, further comprising:

replacing the boundary values in the register with the first and second scaled values; and shifting each boundary value in the register left by one bit, after transmitting a bit signal.

14. The method of claim 13, further comprising:

testing the two most significant bits in each of the first and second digital signals; and removing a next to the most significant bit from each boundary value in the register, in response to the two most significant bits of the first digital signal being 01b and the two most significant bits of the second digital signal being 10b.

15. A method for storing the boundaries of a segment, comprising:

storing a representation of an upper boundary of the segment in a first register;

storing a representation of an lower boundary of the segment in a second register;

removing a second to the most significant bit from each of the first and the second registers when two most significant bits in the first register are 10b and two most significant bits in the second register are 01b; and incrementing a count when a bit is removed from the first register.

16. The method of claim 15, further comprising repeating the removing and incrementing steps.

* * * * *